(12) United States Patent
Rasor et al.

(10) Patent No.: US 8,159,108 B2
(45) Date of Patent: Apr. 17, 2012

(54) INTEGRATED THERMOELECTRIC/ THERMIONIC ENERGY CONVERTER

(76) Inventors: Ned S. Rasor, Cupertino, CA (US); Lorin K. Hansen, Fremont, CA (US)

( * ) Notice: Subject to any disclaimer, the term of this patent is extended or adjusted under 35 U.S.C. 154(b) by 623 days.

(21) Appl. No.: 11/767,433

(22) Filed: Jun. 22, 2007

(65) Prior Publication Data
US 2008/0197747 A1 Aug. 21, 2008

Related U.S. Application Data

(60) Provisional application No. 60/815,757, filed on Jun. 23, 2006, provisional application No. 60/848,795, filed on Oct. 2, 2006.

(51) Int. Cl.
*H02N 3/00* (2006.01)
(52) U.S. Cl. .................................. 310/306; 136/206
(58) Field of Classification Search ............... 310/306; 136/205, 206
See application file for complete search history.

(56) References Cited

U.S. PATENT DOCUMENTS

| | | | | |
|---|---|---|---|---|
| 4,280,074 A * | 7/1981 | Bell | ............................. | 310/306 |
| 4,667,126 A * | 5/1987 | Fitzpatrick | .................... | 310/306 |
| 5,028,835 A * | 7/1991 | Fitzpatrick | ..................... | 313/14 |
| 5,955,772 A * | 9/1999 | Shakouri et al. | .............. | 257/467 |
| 6,100,621 A * | 8/2000 | Rasor et al. | ................... | 310/306 |
| 6,396,191 B1 * | 5/2002 | Hagelstein et al. | ........... | 310/306 |
| 7,109,408 B2 * | 9/2006 | Kucherov et al. | ............. | 136/205 |
| 7,235,912 B2 * | 6/2007 | Sung | ............................. | 310/306 |
| 7,508,110 B2 * | 3/2009 | Chen et al. | ................... | 310/306 |
| 2003/0184188 A1 * | 10/2003 | Kucherov et al. | ............ | 310/306 |
| 2007/0057277 A1 * | 3/2007 | Martsinovsky et al. | ...... | 257/104 |
| 2008/0197747 A1 * | 8/2008 | Rasor et al. | ................... | 310/306 |

OTHER PUBLICATIONS

Hagelstein et al. "Enhanced Figure of Merit in Thermal to Electrical Energy Coversion Using Diode Structure", Applied Physics Letters, vol. 81, No. 3, Jul. 15, 2002.*

* cited by examiner

*Primary Examiner* — Karl Tamai
(74) *Attorney, Agent, or Firm* — Jill L. Robinson

(57) ABSTRACT

A device for converting heat into electrical energy that is an integrated combination of thermionic and thermoelectric energy converters in a single device, or "TITE". The electron output of thermionic portion of the TITE is the input of the thermoelectric portion of the device. The electron collector is covered by a thin layer of doped or undoped semiconductor material or a combination of doped and undoped semiconductor materials with appropriate doping and thickness to achieve increased operational temperature ranges and efficiency.

1 Claim, 7 Drawing Sheets

INTEGRATED THERMOELECTRIC/THERMIONIC ENERGY CONVERTER

CROSS-REFERENCE TO RELATED APPLICATIONS

This invention is a continuation-in-part of provisional patent applications 60/815,757 and 60/848,795 which are incorporated by reference herein.

BACKGROUND OF THE INVENTION

The invention relates to an integrated combination of thermionic energy conversion and thermoelectric energy conversion in a single device. The integrated thermionic/thermoelectric physical process and device are designated by the name "TITE."

A thermionic energy converter is a gaseous electronic device by which heat is converted directly into electric power non-mechanically by thermionic emission or evaporation of electrons from a hot electrode or emitter and their collection or condensation in a colder electrode or collector. A thermoelectric energy converter, or thermocouple, is a solid state device by which heat is converted into electric power by diffusion of electrons and holes down a temperature gradient, and up a potential gradient, in series-connected solid electrical conductors, typically n and p type semiconductors. Typically, the thermoelectric converter comprises an n-type leg paired in electrical series with a p-type leg.

The physical principles and technology of both types of energy conversion are well-understood and have been reduced to engineering practice in practical devices. However, both types of devices have limitations which reduce performance. Certain aspects of earlier devices and background can be found in E. H. Rhoderick, "Metal-semiconductor Contacts", Clarendon Press, Oxford, $2^{nd}$ edition, pages 202-204, 1988; N. S. Rasor, "Thermionic Energy Conversion Plasmas", invited review, IEEE Trans. on Plasma Sci. Vol. 19, pages 1191-1208 (1991).

In thermionic energy converters the negative space charge of the electron gas, unless compensated, produces an electron potential energy barrier which limits the electron current during its passage between the hot and cold electrodes. This space charge and the resulting barrier can be suppressed by an electron-accelerating electric field between the electrodes or by introduction of positive ions to form a neutral plasma, allowing a much larger interelectrode spacing than would be possible using a vacuum.

Another basic performance limitation in thermionic energy converters is excessive electron energy loss at the collector. The electron gas reaching the collector is much hotter than the collector and its available thermal kinetic energy, 0.2-0.3 eV, (eV=electron volts), accordingly is wasted upon collection. Also, the electrons lose even more potential energy as they are collected across the potential energy barrier at the collector. This electron potential energy barrier at a surface. which is essentially the heat of electron vaporization or condensation, is known as the work function. Because the lowest work function practically available is greater than $\phi_C \sim 1.4$ eV, the output voltage of the converter is greatly reduced and low temperature heat rejection cannot be effectively used. Thus, the emitter temperature must be very high to obtain practical output currents. In general, the efficiency of current thermionic devices that utilize plasma is in the range of 25-30% of Carnot efficiency.

The electrical and thermal performance of thermoelectric energy conversion also is limited primarily by two physical processes. First, the hot electron gas must diffuse up a potential gradient through the crystal lattice of a solid from the device's hot side to its cold side. This means that the forward current of electrons is reduced by a nearly equal counter-current that greatly limits the magnitude of the net output current obtainable at a given output potential difference. It also means that about half of the electrical power generated is dissipated by ohmic resistance to electron flow through the solid.

The second primary limitation in thermoelectric energy conversion is that a continuous solid path for heat conduction exists between the heat source and the heat sink. Since non-productive heat conducted through the solid generally is much greater than the heat transported by the electron current, the basic thermal efficiency of thermoelectric conversion is small, only about 10-15% of Carnot efficiency. It is difficult to find materials that are both appropriate for thermoelectric energy conversion and have sufficiently low thermal conductivity, since reducing lattice phonon heat conduction requires weak inter-atomic bonds, and weak bonds are accompanied by thermal and mechanical instability of a solid.

It is an objective of the current invention to provide a device that allows conversion of heat into electrical energy that is more efficient than current thermionic and thermoelectric devices.

It is a further objective of the invention to provide a device that will function effectively at a broader range of heat source and heat sink temperatures than existing thermionic and thermoelectric devices.

BRIEF SUMMARY OF THE INVENTION

The TITE device integrates the physical electronic processes of thermionic and thermoelectric within a single device. The combination is a complete integration of physical electronic processes within the device rather than a simple series passage of heat through separate thermionic and thermoelectric devices.

In the TITE device, hot electrons from the emitter or plasma in a thermionic discharge are collected by an appropriately selected semiconductor or undoped semiconductor material layer on the metal collector electrode. The electron current and energy output from the thermionic region of the interelectrode space becomes the electron current and energy input to the thermoelectric region. The result is a more than doubled output voltage of the TITE converter over that of most conventional thermionic converters because of the lowered heat rejection temperature. Further, because of the elimination of the parasitic lattice phonon heat conduction present in the conventional thermoelectric converter by isolating its hot end from a solid heat source, the thermal efficiency of energy conversion for the TITE converter is higher than that for the conventional thermionic and thermoelectric converters. Additionally, by creating an advantageous ohmic contact at the collector/layer interface by doping, gradation, and materials selection, a current limiting barrier can be avoided, increasing the overall performance of the device.

In the vacuum mode, the distance between the emitter and collector must be small, usually on the order of <10 μm. In the plasma modes of operation employed in versions of TITE described herein practical interelectrode spacings of 0.3 to 1 mm are possible.

Additionally, the range of preferred emitter temperatures is from 1000 K to 2000 K, and preferred collector temperatures from 300 K to 1000 K, a far greater range than can be found in existing thermionic or thermoelectric devices.

BRIEF DESCRIPTION OF THE SEVERAL VIEWS OF DRAWINGS

DETAILED DESCRIPTION OF THE INVENTION

Figure 1:
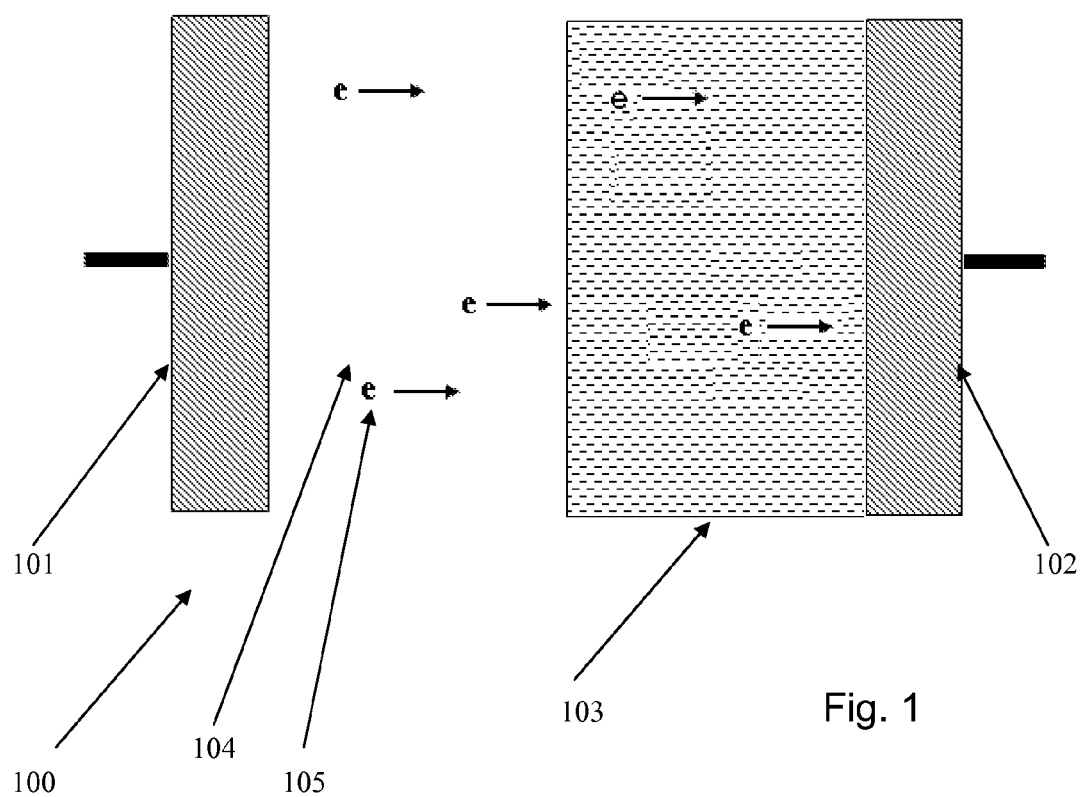
FIG. 1 is a schematic representation of the simplified TITE device.
Figure 2:
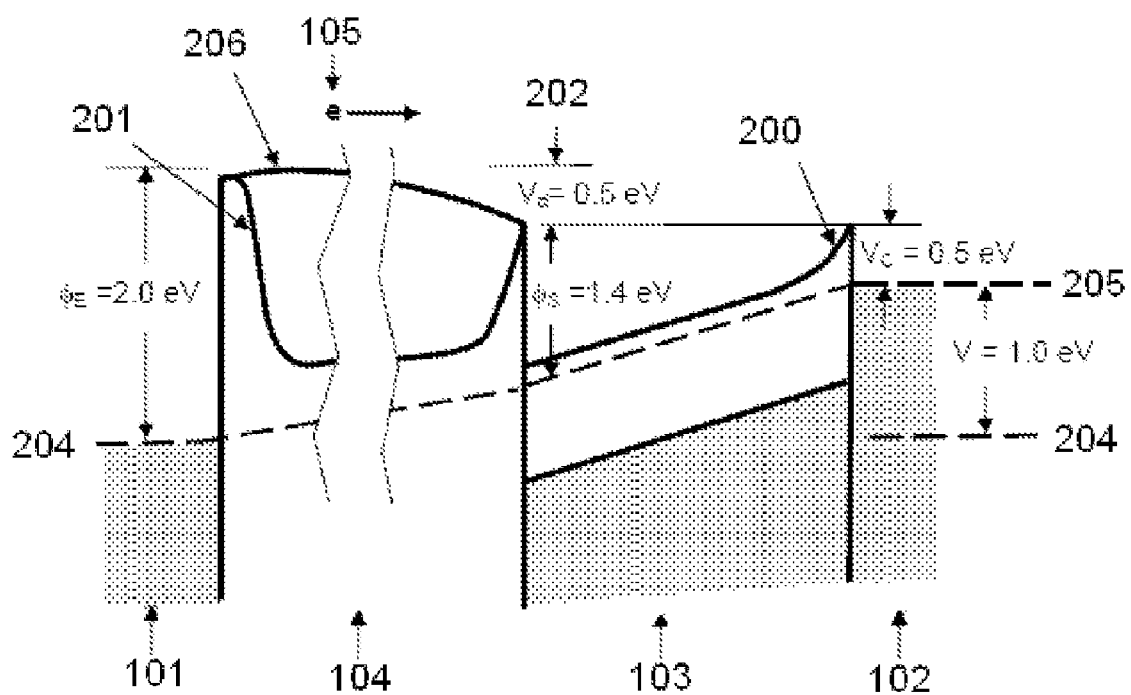
FIG. 2 is a motive diagram of the simplified TITE device with a single n-type semiconductor layer.

In its most basic form, with reference to FIGS. 1 and 2, the TITE device 100 comprises an emitter 101, a metallic collector 102, and a semiconductor coating 103 on the collector 102. The emitter 101 is separated from the semiconductor—or, alternatively, an undoped semiconductor material layer—coating 103 by a gap 104 comprising either a vacuum (including quasi-vacuum, as described below) or plasma. As in current thermionic devices, cesium vapor, which is the most easily ionized of all the stable elements, can be used in the gap 104 in the plasma or quasi-vacuum. The gap 104 is generally on the order of <10 μm for vacuum modes of operation as described further below, although larger gaps can be achieved by reducing the output current, and the gap can be on the order of 0.3 to 1 mm for vapor or plasma modes. In operation, upon exposure to heat, hot electrons 105 are emitted by the emitter 101, move across the vacuum or plasma gap 104, and are injected at high potential energy directly into the semiconductor or undoped semiconductor material coating 103 layer for thermoelectric conversion of their energy into additional electric power at the collector 102. Effectively, then, the electron current and energy output from the thermionic region of the device becomes the electron current and energy input to the thermoelectric region of the device.

A portion of the potential energy of the electrons incident on the semiconductor generally is converted to kinetic energy as they traverse the potential energy drop at the semiconductor surface, in addition to their initial thermal kinetic energy. A large fraction of the total kinetic energy of collected electrons thereupon is converted into potential energy as they traverse an electron-retarding potential energy gradient in the semiconductor, resulting in only cold electrons near the collector potential and temperature reaching the metal collector electrode after traversing the semiconductor layer.

Thus, the substantial thermal and potential energy from the hot electron gas from the thermionic discharge, which is ordinarily wasted as heat rejection at the collector in existing thermionic devices, is made available for conversion to electrical power in the semiconductor portion of the TITE device. As a result, the output electrical power densities of the TITE converter are similar to those typically obtained for thermionic converters (2-10 watts $cm^2$), and are much greater than those obtained for thermoelectric converters. Further, the TITE converter can operate efficiently both over the high temperature range formerly restricted to thermionic converters and over the lower temperature range formerly restricted to thermoelectric converters. The heat source temperature required for a given level of performance is greatly reduced.

The temperature of the collected electrons depends primarily on the mode of thermionic discharge. There are currently four modes of discharge all of which may be used in a TITE device: ignited or arc mode in which plasma is maintained internally by means of impact ionization by hot plasma electrons; unignited plasma mode in which the plasma is maintained by means of the injection of positive ions into cold plasma; hybrid mode comprising transfer of ions from a hot plasma region to a cold plasma region; and a vacuum or quasi-vacuum mode. Further, as is known to persons of ordinary skill in the art, in the quasi-vacuum mode, the gap contains sufficient cesium vapor to produce low electrode work functions by adsorption, but at such a low pressure and small electrode spacing that there are virtually no electron-atom collisions and electrons behave as in the vacuum mode of operation.

With reference to FIG. 2, the motive diagram for a simplified TITE is shown with an n-type semiconductor layer 103. With an emitter 101 temperature of 1370° K, the work function of the emitter is approximately 2.0 eV. In ignited mode 201 the temperature of the plasma electrons 105 will be approximately 3300° K with a collected electron temperature of approximately 2100° K. In the other modes of operation 206 the temperatures of the plasma or vacuum electrons 105 and collected electrons is approximately that of the emitter. The work function of the surface of the semiconductor layer 103 with adsorbed cesium is approximately 1.4 eV, with an arc drop in ignited mode of 0.5 eV, less than 0.1 eV in the other modes of operation. In the device shown, the temperature of the collector 102 would be approximately 330° K, and the resultant output voltage, that is the difference between the emitter Fermi energy 204 and the collector Fermi energy 205, is approximately 1.0 eV. The overall thermal efficiency of the TITE device for operation in the ignited mode at these temperatures, with a back voltage of $V_B$ ~1.1 eV, would be approximately 29%. The efficiency would be approximately 17% for 1000 K emitter temperature, and approximately 37% efficiency for 1800 K emitter temperature.

In other modes the efficiency of the TITE converter corresponds to a back-voltage of $V_B$~0.7 eV, consisting of the sum of 0.1 eV arc drop in the thermionic discharge, 0.5 eV Schottky barrier at the semiconductor/collector electrode interface, and 0.1 eV current attenuation voltage. The efficiency of the TITE converter corresponding to this value of $V_B$ is ~34% at emitter temperature 1000K, ~43% at 1370K and 49% at 1800K. The efficiency of the conventional thermionic converter ($V_B$~2.1 eV) is less than ~0.01% at 1000 K emitter temperature, ~2.5% at ~1370K and ~12% at 1800 K for an optimum ~900K collector temperature. The efficiency of the conventional thermoelectric converter is <10% at 1000 K hot junction temperature and 330 K cold junction temperature, <11% at 1370K and generally its operation at 1800 K is not practically feasible.

The above description represents an idealized and simplified version of the TITE device. As a practical matter, in order to create a functioning TITE device, a number of physical phenomena and requirements must be taken into account. Additionally, using techniques known in the art, the feature of current control may be added to TITE devices.

Composition and Thickness of the Semiconductor Coating

First, the semiconductor coating 103 must be of a thickness approximately equal to or less than approximately three times the scattering length, or the mean free path, of the electrons in the semiconductor material to allow the incident electrons to reach the collector 102 without thermalizing at the semiconductor lattice temperature. However, the layer thickness must simultaneously be much greater than the lattice spacing in the semiconductor to obtain the unique electronic properties of the semiconductor.

The electron scattering length in the semiconductor layer depends on the semiconductor material, on the concentration of the dopant, on the material temperature and on the electron kinetic energy. Materials with large scattering lengths that are stable and compatible with cesium vapor at collector temperatures and required cesium vapor pressures are preferred. It should be noted that collector temperatures can be very low for TITE operation, and required cesium pressures are very low for the low emitter temperatures required.

The scattering length in silicon monocrystal is on the order of 0.2 μm and in GaAs monocrystal is on the order 0.6 μm, for thermal electrons at room temperature and typical dopant levels. However, the scattering rate rapidly increases and the scattering length becomes smaller with increasing electron kinetic energy. Since the electrons incident on an n-type semiconductor layer in the TITE are accelerated at its surface to kinetic energies about equal to the work function of the semiconductor—typically on the order of 4.5 eV in vacuum and 1.4 eV in cesium vapor—the scattering length, and thus the required layer thickness, is greatly reduced. This may present a significant challenge in the design of the device. Without other modifications, optimum thickness would range from the electron scattering length, typically on the order of less than 5 μm, to 100 times the semiconductor lattice spacing, typically on the order of 50 nm, and the doping concentration must be adequate to compensate the space charge of the injected electrons and to maintain the conduction band within ~0.1 eV above the Fermi level, but be low enough to not significantly reduce the scattering length (preferably in the range $10^{14}$ to $10^{18}$ per cubic cm).

Figure 3:
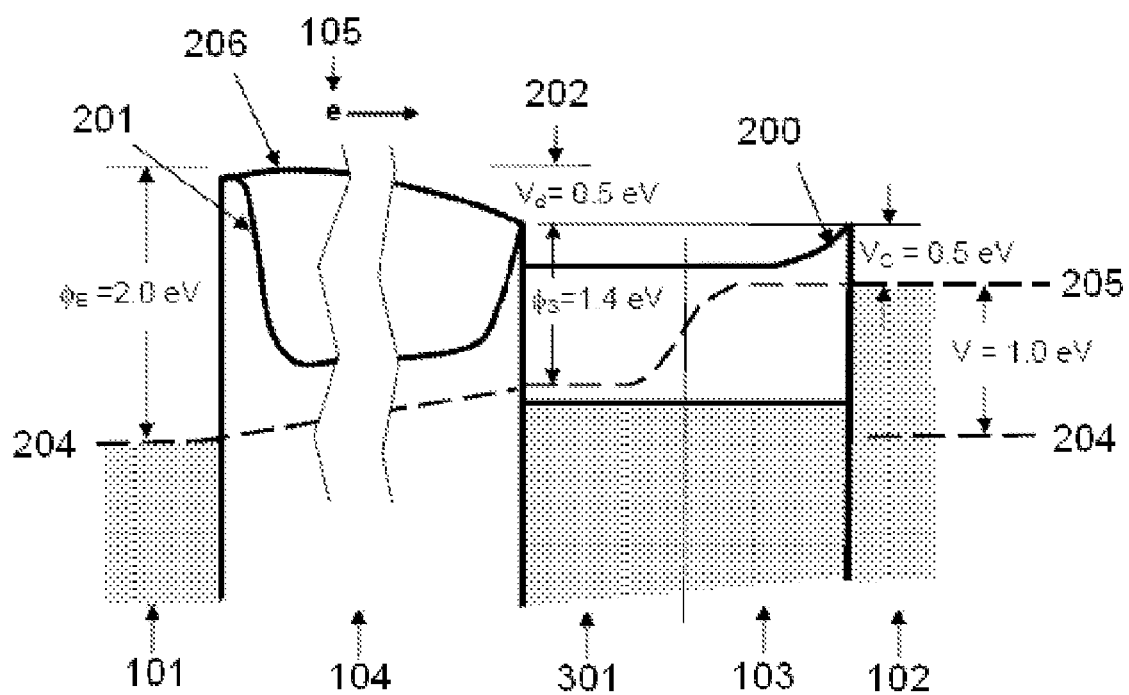
FIG. 3 is a motive diagram of the simplified TITE device with a p-type and n-type semiconductor layer.

Another means of minimizing the adverse effect on required layer thickness when high kinetic energy electrons traverse an n-type semiconductor layer is to utilize a narrow p-type region 301 to collect electrons from the thermionic discharge, with a subsequent deceleration of the electrons in a p-n junction, and an n-type region in contact with the metallic collector. As shown in FIG. 3 incident electrons remain in the conduction band with much lower kinetic energies, typically with only a few tenths of an eV in a silicon p-n layer, thereby maintaining a greater scattering length and required layer thickness. However, the use of the built-in potential energy gradient of a p-n junction and collector barrier requires a doping (carrier) concentration sufficient to obtain a Debye length adequately less than the thickness of the layer. This requirement must be considered in selecting the optimum concentration.

Suppression of Reverse Current

Second, it is necessary to prevent substantial reverse current of electrons from the metal of the collector 102 into the semiconductor coating 103. One means of addressing this problem with n-type semiconductor material is to create a Schottky-type barrier 200 of an appropriate type and height at the contact junction between the collector 102 and the semiconductor coating 103. Such a barrier must be sufficiently high to prevent substantial reverse current of electrons from the metal into the layer, specifically $V_C > \sim kT_C \ln(10AT_C^2/J_0)$, where $V_C$ (eV) is the barrier height, $T_C$ (K) is the collector temperature, $J_0$ (amp/cm$^2$) is the forward output current density, $k = 1/11600$ eV/K is the Boltzmann constant and $A = 120$ amp/cm$^2$K$^2$ is the Richardson-Dushman constant. For example, $V_C$ typically must be greater than ~0.5 eV for $J_0 = 10$ amp/cm$^2$ and $T_C = 330$ K. Yet the barrier 200 height $V_C$ must not be substantially greater than this value since any increase above it subtracts directly from the output voltage (the difference between the emitter Fermi energy 204 and the collector Fermi energy 205) of the TITE device. Means for control of the barrier 200 height $V_C$ are well-known in the art.

The most practical method is production of a very thin and highly doped layer in the semiconductor at the metal-semiconductor or metal-undoped-semiconductor-material junction, by deposition or ion-implantation of donor atoms. Barrier heights of 0.4-0.6 eV for metal-silicon contacts are readily obtained by this method, although other methods and materials described also are applicable for this purpose.

Figure 4:
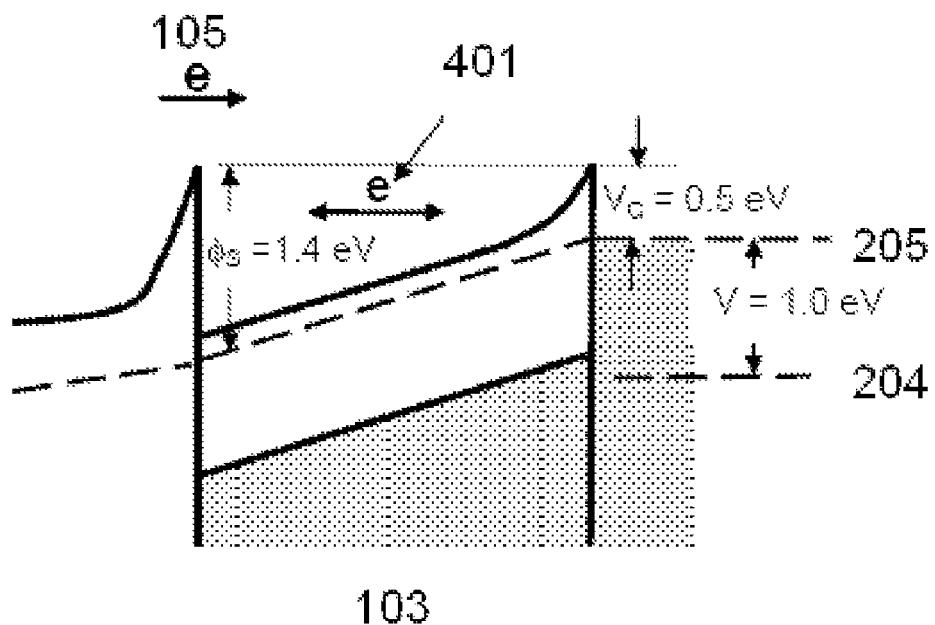
FIG. 4 is a motive diagram showing trapped electrons within the semiconductor layer of the simplified TITE device shown in FIG. 2.
Figure 5:
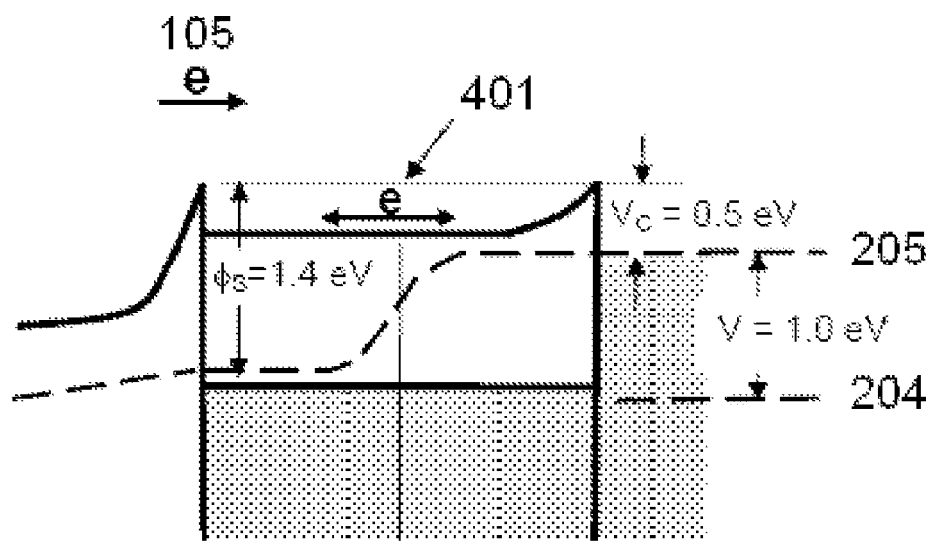
FIG. 5 is a motive diagram showing trapped electrons within the semiconductor layer of the simplified TITE device shown in FIG. 3.

Eliminate Degraded Performance Caused by Trapped Electrons in the Semiconductor Layer Third, with reference to FIGS. 4 and 5, with either the n-type 103 or p-n semiconductor 301, 103 layer, trapped electrons 401 in the semiconductor layer can degrade the performance of the TITE by adverse space charge and electron-electron scattering processes.

Figure 6:
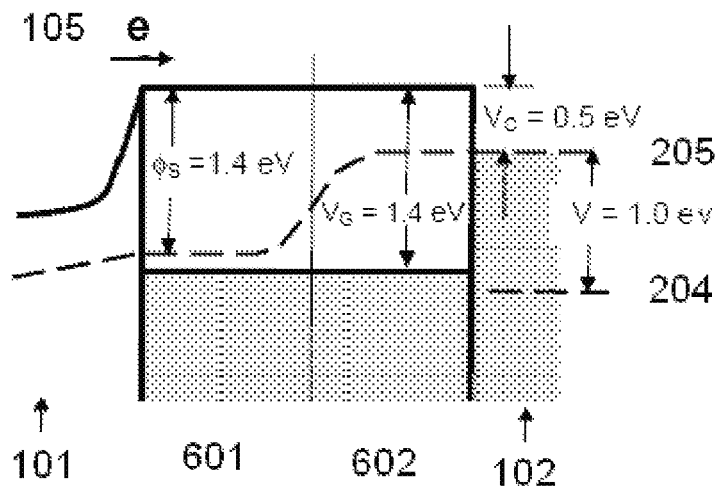
FIG. 6 is a motive diagram for a TITE device utilizing cesium vapor with GaAs or CdTe p-type and n-type layers appropriately selected to eliminate electron trapping.
Figure 7:
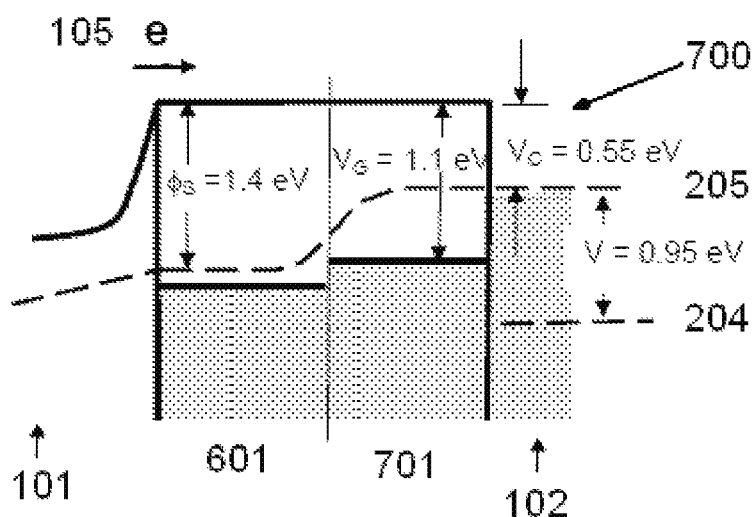
FIG. 7 is a motive diagram for a TITE device utilizing cesium vapor with an undoped Si material selected to eliminate electron trapping.
Figure 8:
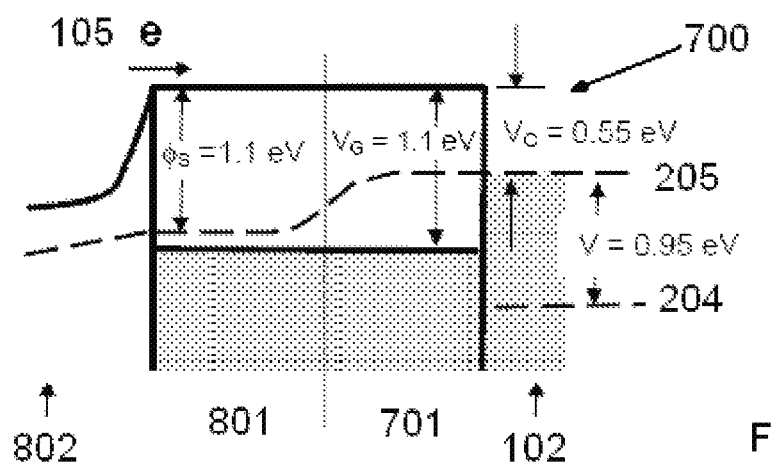
FIG. 8 is a motive diagram for a TITE device utilizing cesium/oxygen vapor with Si p-type and an undoped material selected to eliminate electron trapping.

With reference to FIGS. 6, 7, and 8, electron trapping at the incident side of the semiconductor layer can be avoided by use of a semiconductor material there that has approximately zero electron affinity in cesium vapor 602, that is, one that has a band gap width $V_G$ about equal to its work function, for example, GaAs or CdTe with $V_G - \phi_S \sim 1.4$ eV in cesium vapor. The p-type region 601 has the usual density of low excitation potential dopant, but the n-type region 602 has a high excitation potential dopant or dopant density such as to give a conduction band ~0.5 eV above the Fermi energy for a collector 102 temperature of approximately 330° K. Electron trapping at the collector side of the layer is avoided by having a contact junction there with zero barrier height (with an ohmic or non-rectifying contact). As can be seen in FIG. 6, in addition to essentially eliminating electron trapping in the conduction band this design eliminates the need for a Schottky-type barrier at the collector to prevent back-flow of electrons from the collector. Further, the kinetic energy of the electrons in the conduction band is minimized, reducing the electron scattering probability and relaxing a constraint on the thickness of the layer.

Additionally, as shown in FIG. 7, it is possible to essentially eliminate electron trapping in a TITE device without special doping of the n-type semiconductor by having a p-type region 601 with zero electron affinity as before, but with an undoped semiconductor material 701 having an appropriate band gap $V_G$ between it and the metal collector 102. The Fermi energy at the collector thereby is at the middle of the band gap of the undoped material 701, giving a required barrier 700 height $V_C=V_G/2$ at the collector. The required value of $V_C$ is that which prevents appreciable back flow of electrons from the collector. For example, the use of silicon, having $V_G$ on the order of 1.1 eV, as the undoped material 701 gives the barrier 700 height $V_C$ on the order 0.55 eV required for $T_C<\sim 360$ K. Again a contact junction with $V_C\sim 0$ is required at the collector.

Furthermore, as shown in FIG. 8, use of a cesium/oxygen vapor 802 causes the work function $\phi_S$ for silicon to be on the order of 1.1 eV. Thus, in ignited mode TITE devices that utilize cesium/oxygen vapor 802 (i.e., a mixture of cesium and an oxygen-containing molecular species) a single layer material, such as a silicon layer doped p-type on one side 801 and undoped or lightly doped n-type silicon on the other side 701 can be used.

Figure 9:
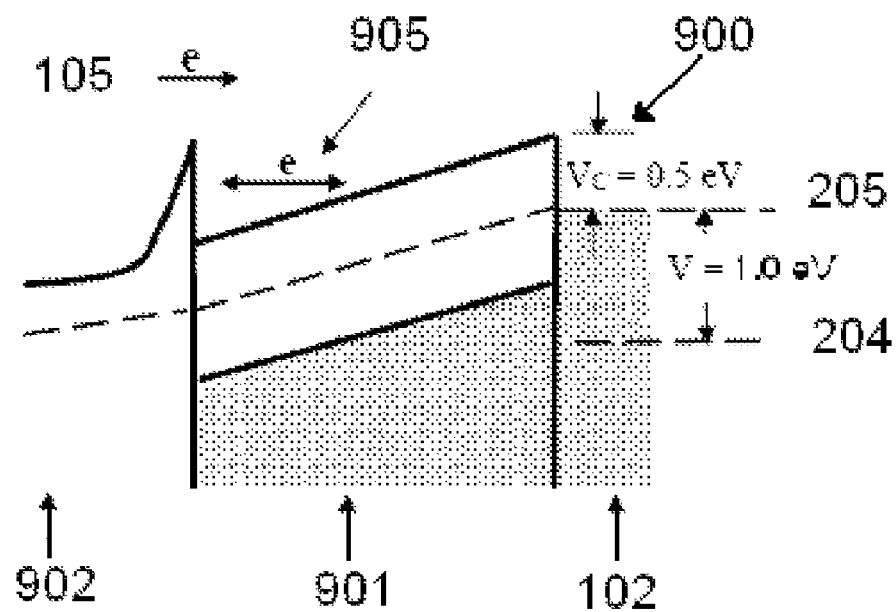
FIG. 9 is a motive diagram for TITE converter with uniform undoped semiconductor material layer, initially before accumulation of appreciable density of trapped electrons in layer.
Figure 10:
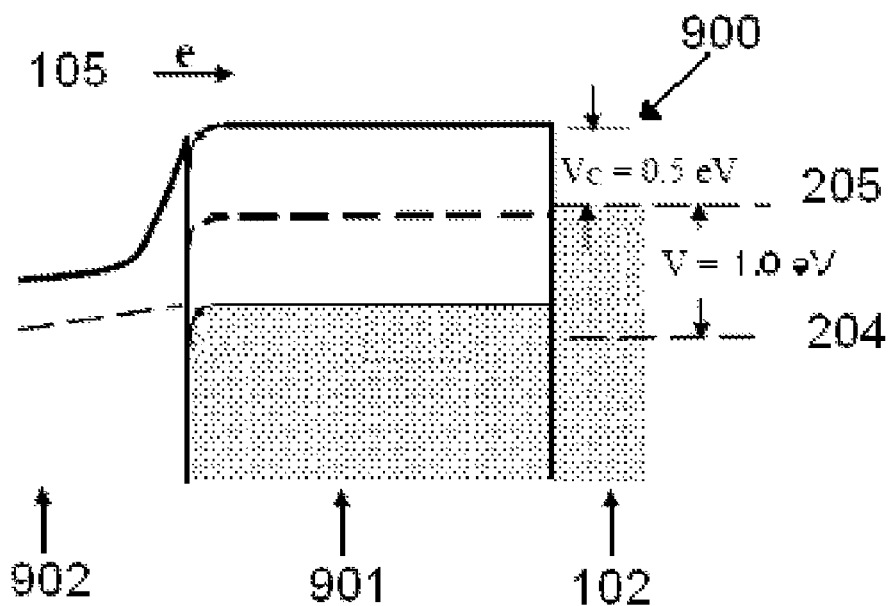
FIG. 10 is a motive diagram for TITE converter with uniform undoped semiconductor material layer, at steady state after sufficient space charge accumulation and occupied electron surface states exist to produce a constant-potential conduction band within the layer.

Finally, with reference to FIGS. 9 and 10, by using a single uniform layer of an undoped silicon or other low scattering semiconductor material 901 the deleterious effect of trapped electrons can be overcome. The undoped layer 901 is of sufficient thickness for accumulation of space charge, on the order of 0.2 to 1.0 μm, and has sufficiently charged surface states. As shown in FIG. 9, electrons 105 move across the gap or vapor 902 and are trapped initially within the incident side of the layer 901. The trapped electrons 905 can escape the trap only by reaching a very high density and by capture in surface states. This results in a high negative charge density within the trap region that increases the potential energy there by band-bending until the trap, and trapped electrons 905, are effectively eliminated as in FIG. 10. This maintains electrons in the conduction band, preserving the electron potential energy and maintaining minimum kinetic energy as the electrons cross the layer 901 and are collected at the collector 102. Further, the undoped layer 901 forms an ohmic contact junction with the metal portion of the collector 102 which has a band gap sufficient to produce an electron potential energy barrier 900 of appropriate height at the contact junction whereby an appreciable back flow of electrons from the metal portion to the coating is prevented.

Current Control

It is well-known that that the output current of the advanced types of thermionic converter, such as triodes and pulsed diodes, can be modulated to obtain output power conditioning as an integral function of its operation. It should be obvious to those skilled in thermionic energy conversion technology, therefore, that the use of advanced types of thermionic converter operation in the TITE device would make it possible to achieve integral power conditioning in the operation of the TITE device as well.

Experimental Results

To explore the validity of using an undoped semiconductor material layer on the collector to reduce electron energy losses at the collector, experiments were performed in vacuum. A cumulative succession of pure silicon layers was vapor-deposited onto a molybdenum collector surface. Current vs. voltage (J-V) characteristics were obtained at each increased layer thickness using a tungsten filament as the thermionic emission source for the electron current into the silicon layer. Since all conditions of the measurements were maintained constant for all layer thicknesses, the shift in voltage of the J-V curves gave a direct indication of the change in potential energy of collected electrons vs. layer thickness.

Semiconductor-quality silicon crystals were crushed and heated to vaporization temperatures in a resistance-heated tantalum cup. A glass microscope slide was interposed between the silicon vapor source and the collector surface during initial heating and outgassing of the silicon granules. Thereafter, when the silicon vapor source was heated to give a rapid rate of silicon deposit as indicated visually on the glass slide, the slide was moved laterally to expose the collector to the silicon vapor beam and begin silicon deposition on the collector. The layer thickness was determined by visual observation of the number and color of light interference fringes on the adjacent glass slide.

Two test series were performed giving essentially the same results confirming the validity of the basic mechanisms required for feasibility of the described TITE device operation. Accuracy, degree of control and other conditions were improved for the second test series which is described here.

Figure 11:
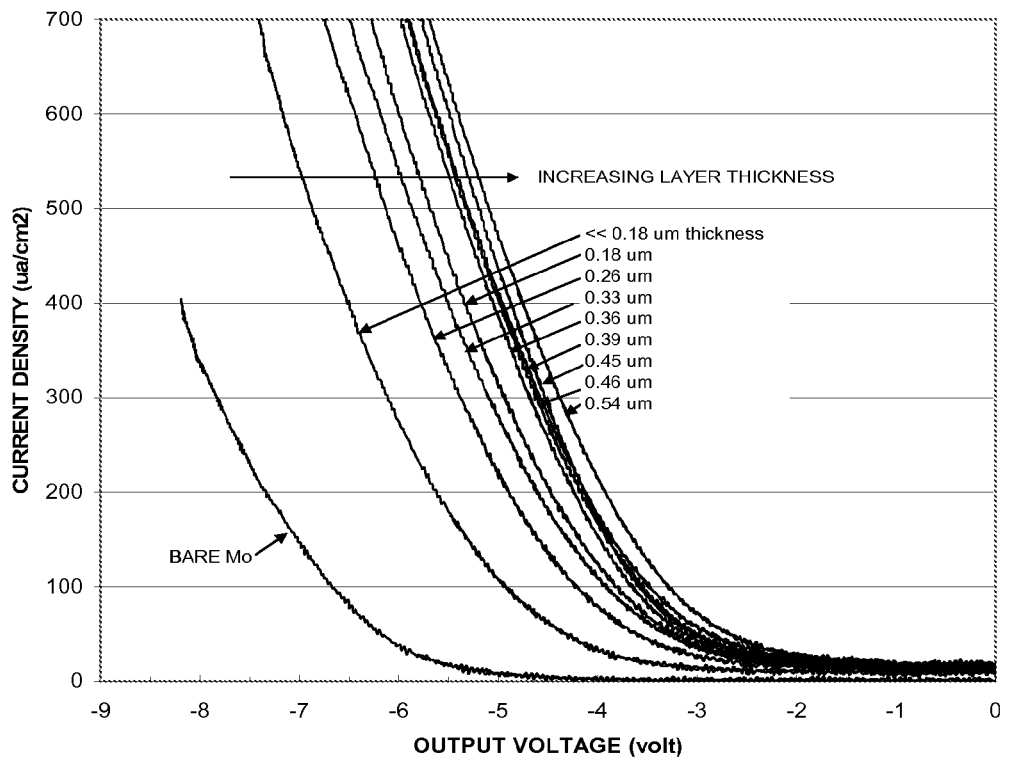
FIG. 11 shows experimental results, specifically the shift of J-V curves vs. layer thickness during silicon vapor deposition.

FIG. 11 shows the J-V curves obtained after successive silicon depositions in the second test series. A J-V curve was obtained for when the very first visible deposit appeared on the glass slide monitor. The thickness of this deposit could not be determined in the absence of optical interference effects, but it can be safely assumed that its thickness was much smaller than that of the first fringe thickness. This curve has special significance in that the thickness clearly was great enough to cause a change in work function from that of the collector (probably Mo with adsorbed oxygen) to that of the deposited Si layer which should be independent of thickness thereafter. Further changes with thickness, therefore, arise only from solid state electronic property changes important to the TITE processes. Successive depositions of silicon up to a total thickness of 0.54 micrometers produced a shift of 1.7 volt in the J-V curves, indicating a very substantial increase of 1.7 eV in the potential energy of the collected electrons by electronic processes within the solid layer, independent of surface effects. The rate of increase in potential energy with layer thickness decreased after a layer thickness of ~0.2 micrometers, which is consistent with an electron scattering length of ~0.2 micrometers in silicon and the postulated mechanism of electron potential and kinetic energy preservation within the layer. Measurements were not performed at greater silicon layer thickness because previous deposition tests showed that the layer ruptured at thicknesses greater than ~0.55 micrometers, i.e., when the tensile stress within the film exceed the force of its adhesion to the molybdenum substrate.

Figure 12:
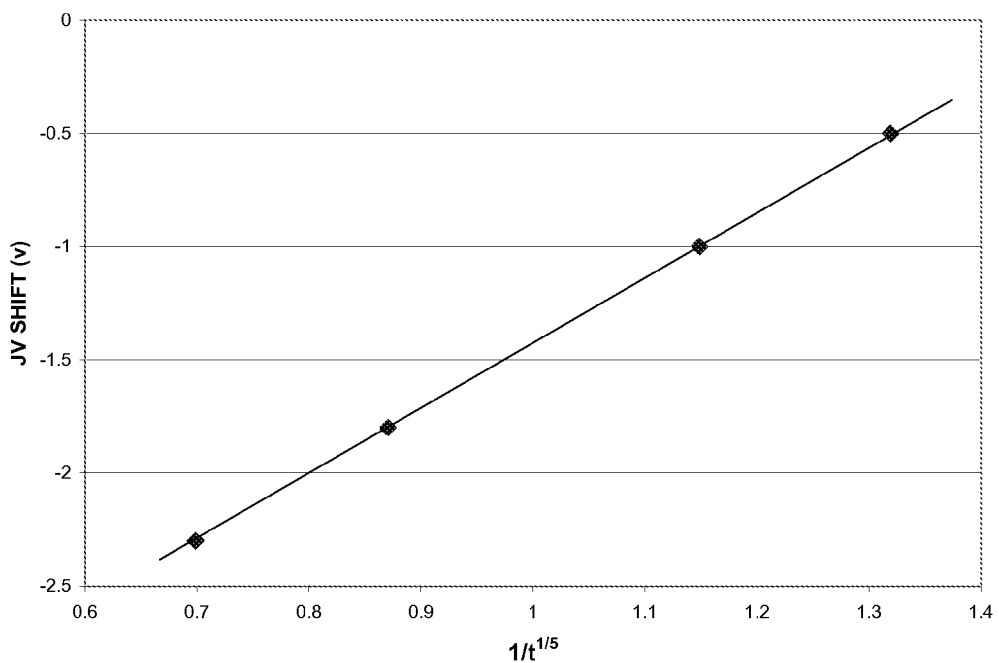
FIG. 12 shows experimental results, specifically the post-deposition shift in J-V curve showing linear dependence on $1/t^{1/5}$ at time t in hours after final deposition.

FIG. 12 shows the continuous decrease in voltage shift after deposition as also observed in the first test. The observed decay of the J-V shift is well-characterized by a time dependence on $1/t^{1/5}$ indicating that a solid state diffusion process is dominant and that it consists of several different steps. It is likely that the process is the diffusion of oxygen into the Si layer with the various known $Si_xO_y$ compounds being involved. It is expected, therefore, that such oxidation and decay of the beneficial effects will not occur in the presence of cesium vapor in an actual TITE device since the great affinity of cesium for oxygen causes the concentration of oxygen present to be many orders of magnitude less than that which could cause the observed solid state effect.

Accordingly, a large reduction in potential energy loss of electrons collected by an undoped semiconductor material layer has been observed. These results strongly support the validity of the electronic processes required for practical feasibility of the TITE energy converter concept. As described, such a large reduction of energy losses at the collector by thermoelectric processes in the collector layer would greatly increase the efficiency of the TITE energy conversion process over that obtainable with conventional thermionic and thermoelectric energy conversion devices.

While the present invention has been shown and described with reference to the foregoing embodiments, it will be apparent to those skilled in the art that changes in form, connection, and detail may be made therein without departing from the spirit and scope of the invention as defined in the appended claims:

We claim:

1. A device for converting heat into electric power comprising:

An emitter, which emits electrons when exposed to heat;

A collector, having an approximate operating temperature, for collecting the electrons, wherein the collector is separated from the emitter by a gap, and comprising a metal portion and a coating on the metal portion, wherein the coating is positioned between the metal portion and the gap;

Wherein the coating comprises an n-type semiconductor material layer having a crystalline lattice spacing distance, the electrons have a scattering length in the layer, a contact junction exists between the metal portion and the layer, and the thickness of the layer is between three times the scattering length and 100 times the lattice spacing distance; and wherein a Schottky-type barrier exists at the contact junction such that the barrier height is greater than $kT_C \ln(10AT_C^2/J_0)$, where k is the Boltzmann constant, A is the Richardson-Dushman constant and $T_C$ is the approximate operating temperature of the collector.

* * * * *